(12) United States Patent
Anderson et al.

(10) Patent No.: US 9,056,392 B2
(45) Date of Patent: Jun. 16, 2015

(54) ELECTRIC TESTING DEVICE AND METHOD FOR HAND TOOLS HAVING TESTING MECHANISMS

(71) Applicants: Wayne Anderson, Northport, NY (US); Warren Anderson, Northport, NY (US)

(72) Inventors: Wayne Anderson, Northport, NY (US); Warren Anderson, Northport, NY (US)

(*) Notice: Subject to any disclaimer, the term of this patent is extended or adjusted under 35 U.S.C. 154(b) by 201 days.

(21) Appl. No.: 13/833,106

(22) Filed: Mar. 15, 2013

(65) Prior Publication Data
US 2013/0239335 A1 Sep. 19, 2013

Related U.S. Application Data

(60) Provisional application No. 61/612,600, filed on Mar. 19, 2012, provisional application No. 61/612,577, filed on Mar. 19, 2012.

(51) Int. Cl.
| | |
|---|---|
| *B25F 1/02* | (2006.01) |
| *G01R 31/28* | (2006.01) |
| *B25G 1/08* | (2006.01) |
| *B25G 1/12* | (2006.01) |
| *G01R 19/155* | (2006.01) |
| *G01R 1/067* | (2006.01) |

(52) U.S. Cl.
CPC . *B25F 1/02* (2013.01); *G01R 31/28* (2013.01); *B25G 1/085* (2013.01); *B25G 1/125* (2013.01); *G01R 1/06788* (2013.01); *G01R 19/155* (2013.01)

(58) Field of Classification Search
CPC .......... B25F 1/02; B25G 1/125; B25G 1/085; G01R 19/145; G01R 1/06788
USPC .......................... 7/164, 165; 81/439; 324/556
See application file for complete search history.

(56) References Cited

U.S. PATENT DOCUMENTS

| | | | | |
|---|---|---|---|---|
| 6,100,679 | A * | 8/2000 | McCasland | 324/72.5 |
| 6,848,139 | B2 * | 2/2005 | Simon et al. | 7/127 |
| 6,983,506 | B1 * | 1/2006 | Brown | 7/168 |
| 8,826,776 | B2 * | 9/2014 | Junk | 81/52 |
| 2005/0091754 | A1 * | 5/2005 | Dominquez | 7/164 |
| 2008/0309347 | A1 * | 12/2008 | Kurtz | 324/522 |
| 2010/0269263 | A1 * | 10/2010 | Burch et al. | 7/108 |

* cited by examiner

*Primary Examiner* — David B Thomas
(74) *Attorney, Agent, or Firm* — Andrew F. Young, Esq.; Lackenbach Siegel, LLP

(57) ABSTRACT

The invention relates to a hand tool system having an electrical circuit testing indicator for use in a hand held tool used by technicians to determine electric circuit conditions. In a preferred embodiment, the indicator makes use of an electric circuit condition indicating means within a hand tool device having a plurality of bits and tool ends that, in use, will indicate information to determine the circuit condition (live circuit or not). Optionally, light, vibration, and audible indications may be provided to indicate the same information to a user.

10 Claims, 5 Drawing Sheets

ELECTRIC TESTING DEVICE AND METHOD FOR HAND TOOLS HAVING TESTING MECHANISMS

CROSS REFERENCE TO RELATED APPLICATIONS

This application relates to, and claims priority from U.S. Prov. Ser. No. 61/612,600 filed Mar. 19, 2012, the entire contents of which are incorporated herein by reference. This application relates to, and claims priority from U.S. Prov. Ser. No. 61/612,577 filed Mar. 19, 2012, the entire contents of which are incorporated herein by reference.

FIGURE SELECTED FOR PUBLICATION

FIG. 1

BACKGROUND OF THE INVENTION

1. Field of the Invention

This invention relates to an electrical installer hand tool system. More particularly, the present invention relates to an electrical installer hand tool having an activated electrical testing device for testing electrical circuits, wires and the like during use of the hand tool.

2. Description of the Related Art

The use of electrical circuit testers is known in the prior art. More specifically, electrical testers heretofore devised and utilized are known to consist basically of familiar, expected and obvious structural configurations, notwithstanding the myriad of designs encompassed by the crowded prior art which have been developed for the fulfillment of specific requirements. Hand-held electrical testing probes or devices are known in the art for detecting the presence of AC signal potential on a conductor and typically have extending wires with clips or contact probes. The probes are either of a contacting type which requires direct electrical contact with an un-insulated portion of the conductor (electrical wire), or of a non-contacting type which senses the resulting electromagnetic field when placed in proximity to the conductor. There is a safety risk associated with the contacting type probe due to the possibility that the user may receive a harmful electrical shock, so that the non-contacting type probe is preferable.

Also, many types of testers or probes use a visual and/or audible indicator to annunciate the presence of a detected voltage to a user, as well as have manual on/off switches that allow a user to deactivate the probe when not in use. However, devices with switches present a number of disadvantages. If the switch is made of metal, it can act as a conduit to shock and injure the user if the switch comes in contact with a live wire or circuit. A user may forget to turn the switch on before using it, thereby risking a false negative reading, or a user may forget to turn it off causing the batteries to run down. A manual on/off switch can also break with repeated usage over an extended period of time.

Also known are switchless testers or probes that may be contacting or non-contacting. Such devices typically comprise non-conductive material, such as polyvinylchloride, to reduce the risk of electrical shock for a user, and it eliminates the use of a switch through the use of internal circuitry that automatically activates the probe when it senses an electrical current or voltage, thereby reducing the drain on the batteries. Such testers provide either a visual or audible indicator to alert the user to the presence of an electrical current or voltage.

Also known are hand held non-contact voltage testers of the type like pen-like pocket held and battery operated, and have a number of uses. Such devices are used to detect whether a voltage is present at the location or wire being probed. If there is a voltage present, the device either lights and/or an alarm sounds off, repeatedly or continuously for as long as the probe tip is held in the vicinity of the voltage, to signal the operator that a voltage is present. Knowing a voltage is present, the operator will exercise caution around the location or handling the wire, or will turn the voltage off, for example at a circuit breaker panel.

If a location or wire is probed and the device does not light up or sound off, the operator may assume there is no voltage present and may exercise less caution than if a voltage was indicated. In fact, there may be a voltage present, and the reason for the device not indicating the voltage is that the batteries are dead, or the light or sound indicating device are non-operational.

Also known from the conventional art are multiple driving hand tools, for example those of the applicant found in U.S. Pat. No. 6,286,400 and U.S. Pat. No. 5,904,080, the entire contents of which are incorporated herein fully by reference. While suitable for tool bit driving and other uses, their operation has been unitary to driving hand tool uses, requiring a user to release such a driving hand tool during, for example, electrical circuit installation, and reach for an entirely separate testing device, either before or after approaching an electrical circuit. This creates several detriments of time, convenience, electrical shock risk, and lose of multiple separate and expenses devices for a user.

While prior art devices fulfill their respective, particular objectives and requirements, they do not disclose a new electrical circuit tester of the type disclosed herein which may conveniently be incorporated into a variety of hand tools typically used by electrical installers, particularly a driving hand tool. In these respects, the electrical circuit tester according to the present invention substantially departs from the conventional concepts and designs of the prior art, and in so doing provides an apparatus developed for the purpose of allowing a user with a single, multi-purpose hand tool that can efficiently test electrical fixtures with a visual indicator, with improved safety, and enhanced convenience.

ASPECTS AND SUMMARY OF THE INVENTION

The invention relates to a hand tool system having an electrical circuit testing indicator for use in a hand held tool used by technicians to determine electric circuit conditions. In a preferred embodiment, the indicator makes use of an electric circuit condition indicating means within a hand tool device having a plurality of bits and tool ends that, in use, will indicate information to determine the circuit condition (live circuit or not). Optionally, light, vibration, and audible indications may be provided to indicate the same information to a user.

The invention additionally relates to, in a further preferred embodiment, the indicator using a visual indicating means within a clear or transparent cover of the device to reveal a lighting pattern that will provide an experienced technician with information to determine the circuit condition.

The present invention provides a circuit testing device incorporated into a multi-bit hand-held tool for an electrical technician. For example, the device according to the invention is preferably an insertable attachment for co-moldable insertion into the handle of a hand tool such as a screwdriver of the type incorporated by reference; namely applicants U.S.

Pat. No. 6,286,400 and U.S. Pat. No. 5,904,080 (previously incorporated by reference). Such a device comprises a body having first and second ends, the body having an electrical circuit or other circuit means contained therein, power source such as one or more batteries, which may be rechargeable, electrical connectors communicating with electrical circuit means and electrically connected to probes or detectors extending from a first end of the body, a power lead having a first end communicating with the electrical circuit means and a second end communicating with a first power source, and a second power lead having a first end communicating with the electrical circuit means and a second end communicating with a second power source.

It is therefore an aspect of the present invention to provide a new electrical circuit tester apparatus, system, and method which has many of the advantages of the electrical testers mentioned heretofore and many novel features that result in a new hand tool electrical circuit tester system, which is not anticipated, rendered obvious, suggested, or implied by any of the prior art electrical testers, either alone or in any combination thereof.

It is another aspect of the present invention to provide a new electrical circuit tester, which may be easily and efficiently manufactured and marketed for convenient user use in a hand tool form.

It is a further aspect of the present invention to provide a new electrical circuit tester, which is of a durable and reliable construction with reduced electrical shock risk protection for a user.

An even further aspect of the present invention is to provide a new electrical circuit tester which is susceptible to a low cost of manufacture with regard to both materials and labor, and which accordingly is then susceptible of low prices of sale to the consuming public, thereby making such electrical circuit tester economically available to the buying public and to users.

Still yet another aspect of the present invention is to provide a new hand tool electrical circuit tester which provides in the apparatuses and methods of the prior art some of the advantages thereof, while simultaneously overcoming some of the disadvantages normally associated therewith.

Still another aspect of the present invention is to provide a new electrical circuit tester for allowing a user to efficiently test electrical fixtures and switches without releasing a hand tool bit driver allowing a single-hand-tool use for improved convenience.

Still yet another aspect of the present invention is to provide a new electrical circuit tester that saves time and is easy and safe to use preventing electrocution accidents as a result of testing outlets and switches.

Even still another aspect of the present invention is to provide a new electrical circuit tester that is of versatile design for allowing a user to test light switches pre-installation or post-installation, and fixtures and eliminates the need for assistance from another person to help with the testing.

Yet another aspect of the present invention is to provide a new electrical circuit testing device that is readily incorporated into hand tools used by electrical technicians.

Still another aspect of the present invention is to provide a new electrical circuit testing device that provides optionally, visual, vibratory, and audible indicators.

These together with other aspect of the invention, along with the various features of novelty which characterize the invention, are pointed out with particularity in the claims annexed to and forming a part of this disclosure. For a better understanding of the invention, its operating advantages and the specific objects attained by its uses, reference should be made to the accompanying drawings and descriptive matter in which there are illustrated preferred embodiments of the invention. The above and other aspects, features and advantages of the present invention will become apparent from the following description read in conjunction with the accompanying drawings, in which like reference numerals designate the same elements.

BRIEF DESCRIPTION OF THE DRAWINGS

A further understanding of the present invention can be obtained by reference to a preferred embodiment set forth in the illustrations of the accompanying drawings. Although the illustrated preferred embodiment is merely exemplary of methods, structures and features for carrying out the present invention, both the organization and system of the invention, in general, together with the aspects and advantages thereof, may be more easily understood by reference to the drawings and the following description. The drawings are not intended to limit the scope of this invention, which is set forth with particularity in the claims as appended or as subsequently amended, but merely to clarify and exemplify the invention.

For a more complete understanding of the present invention, reference is now made to the following drawings.

DETAILED DESCRIPTION OF THE PREFERRED EMBODIMENTS

Figure 1:
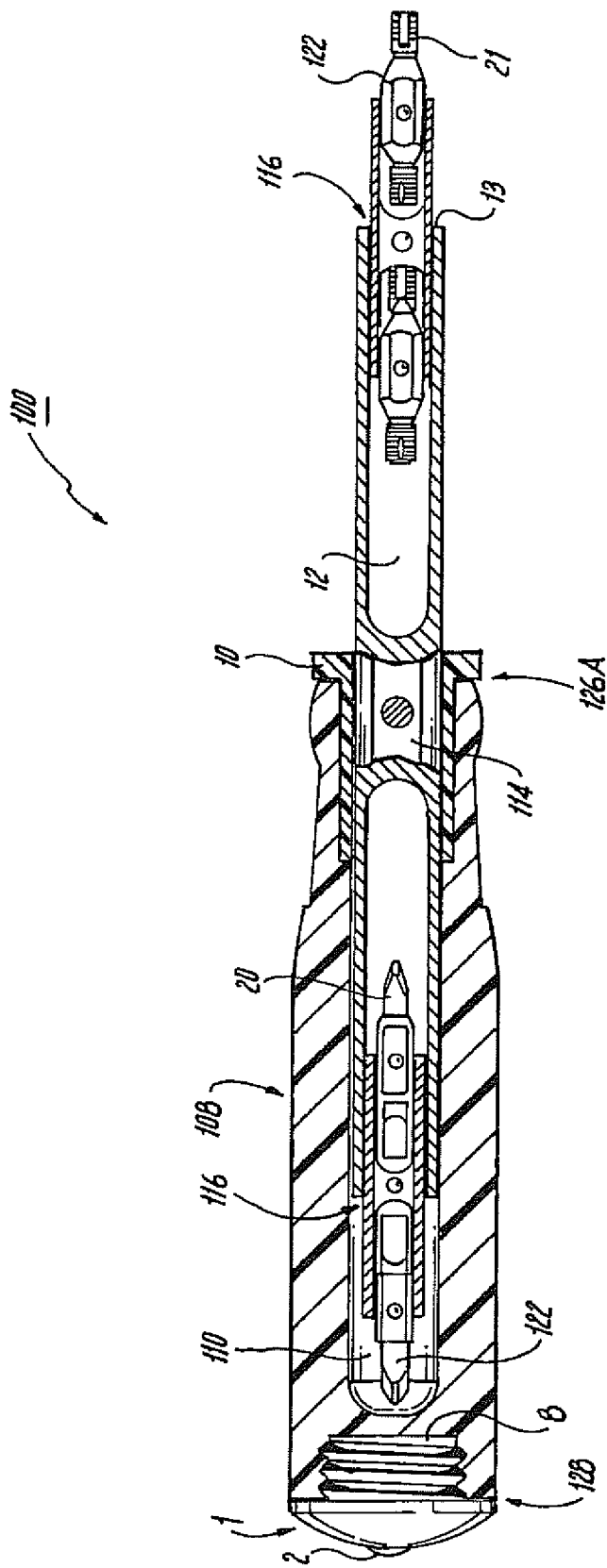
FIG. 1 shows a side cross-sectional view of a non-limiting exemplary hand tool for which the electrical testing indicator device in accordance with the present invention may be used.

As required, a detailed illustrative embodiment of the present invention is disclosed herein. However, techniques, systems, compositions and operating structures in accordance with the present invention may be embodied in a wide variety of sizes, shapes, forms and modes, some of which may be quite different from those in the disclosed embodiment. Consequently, the specific structural and functional details disclosed herein are merely representative, yet in that regard, they are deemed to afford the best embodiment for purposes of disclosure and to provide a basis for the claims herein which define the scope of the present invention. Applicants hereby incorporate herein by reference thereto the entire disclosure of their U.S. Pat. No. 6,209,428, the entire disclosure of their U.S. Pat. No. 5,904,080, the entire disclosure of their U.S. Pat. No. 5,868,048, and the entire disclosure of their U.S. Pat. No. 6,286,400.

Reference will now be made in detail to several embodiments of the invention that are illustrated in the accompanying drawings. Wherever possible, same or similar reference numerals are used in the drawings and the description to refer to the same or like parts or steps. The drawings are in simplified form and are not to precise scale. For purposes of convenience and clarity only, directional terms, such as top, bottom, up, down, over, above, below, etc., or motional terms, such as forward, back, sideways, transverse, etc. may be used with respect to the drawings. These and similar directional terms should not be construed to limit the scope of the invention in any manner.

Figure 2:
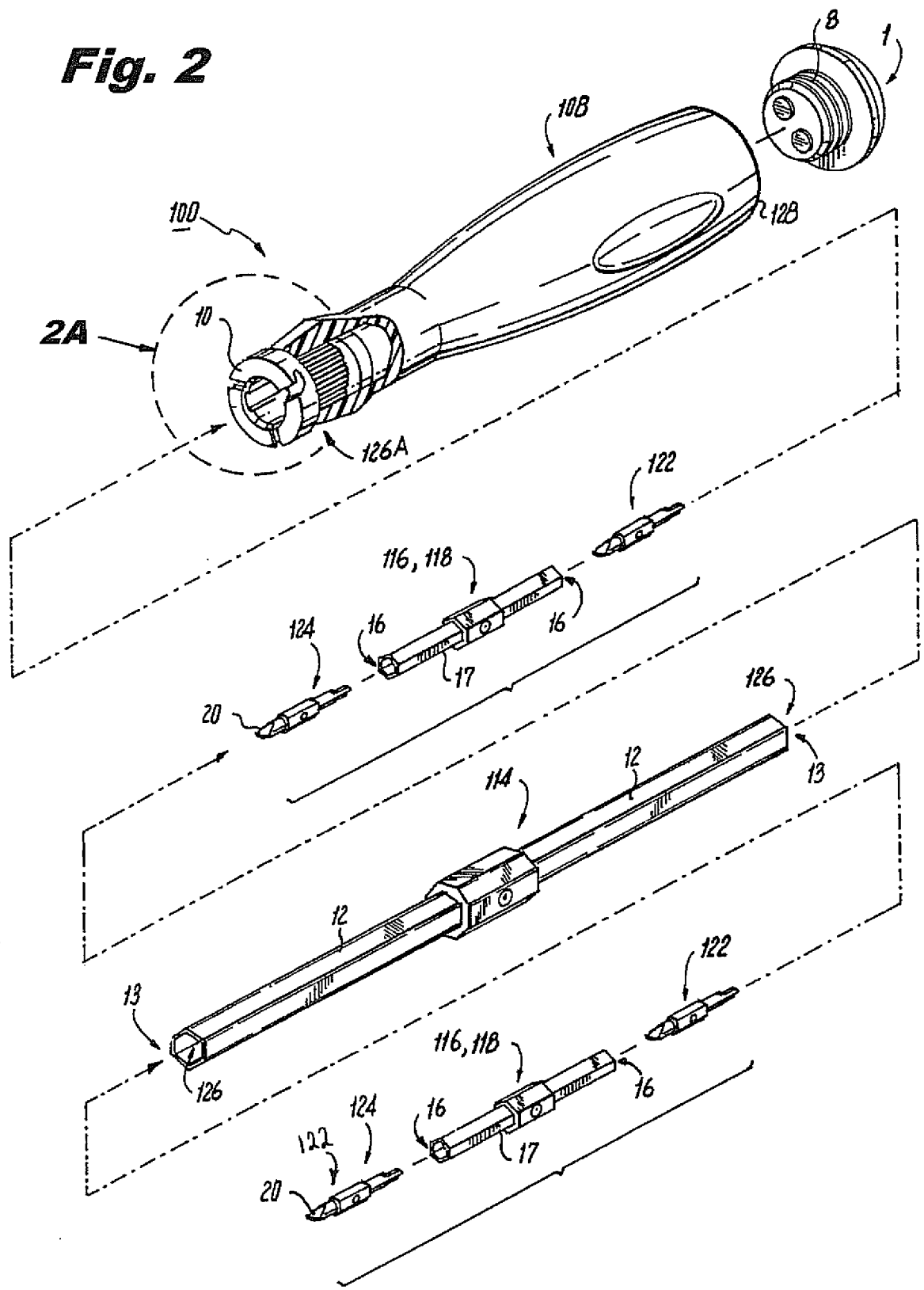
FIG. 2 shows an exploded perspective view of the exemplary hand tool shown in FIG. 1, further showing an electrical testing indicator, and optional wire-bending feature, in accordance with the present invention.

With reference now to the drawings and referring first to FIGS. 1 and 2, shown is one exemplary embodiment of a hand tool 100 for use with this invention. FIG. 1 shows a side cross sectional view of a hand tool having positioned therein the wire bending or shaping device 10 according to the invention having molding ribs 15 for secure molding into the handle, and one or more wire-bending profiles 16, as will be discussed. Shown is a multi-purpose hand tool 100 having a proximate portion and a distal portion. Hand tool 100 may include a master or first cylindrical housing 114 formed of drawn unitary one-piece steel construction having an integral central wall 110 and oppositely disposed hexagonal cavities 12 with hexagonal ends or end portions 13, for purposes hereinafter appearing. A pair of second housings 116 are provided which have outer hexagonal surface 17 for slidably non-rotatably insertion into the respective hexagonal cavities 126 of first housing 114. Housing 116 is formed of drawn unitary one-piece steel construction having an integral central wall and oppositely disposed hexagonal ends or end portions 16, for purposes hereinafter appearing, each having respective further hexagonal cavities 126, as shown.

Also, optionally a plurality of four double-ended tool bits 122 may be provided having either a drive bit 20 (flat-head, phillips-head, star, hex, or any other type of drive bit) or a rethread bit 21 formed at one of the oppositely disposed ends of hexagonal body portion 124 (typical). Tool bit hexagonal body portion 124 is sized to be slidably non-rotatably received in hexagonal cavities 126 (as shown). First housing hexagonal ends 13 and second housing hexagonal ends 16, without the tool bits, also function as differently sized nut drivers, either by covering and driving a hex head, or by being received-in a threaded tool having a hex-head opening. In the embodiment shown, the hand tool 100 may be a variable reach multi-bit driver hand tool. Hand tool 100 has an electrically insulated handle 108 includes a variable reach reversible coupling member 18 having a long reach portion and a short reach portion thereon. Handle 108 has inner cavity 110 of a size and shape for removably retaining reversible coupling member 114. Inner cavity 110 is generally of a depth within handle 108 to accommodate and enclose long reach portion and short reach portion within the interior on the handle.

Figure 2A:
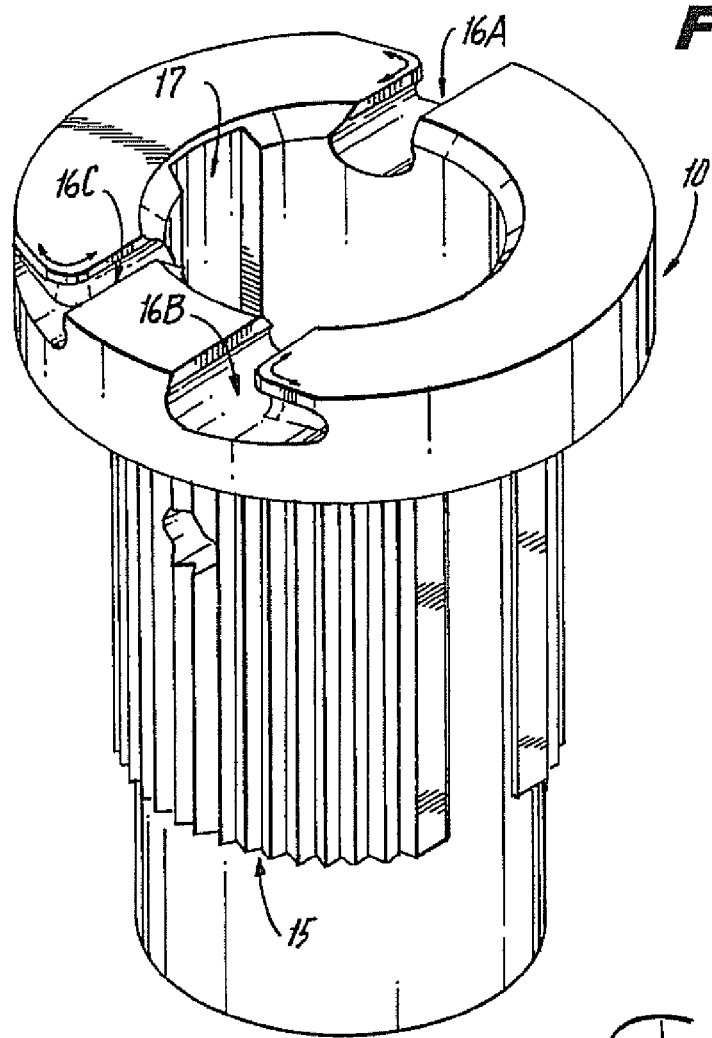
FIG. 2A is a removed portion from FIG. 2, noting an optional wire-bending feature.
Figure 2B:
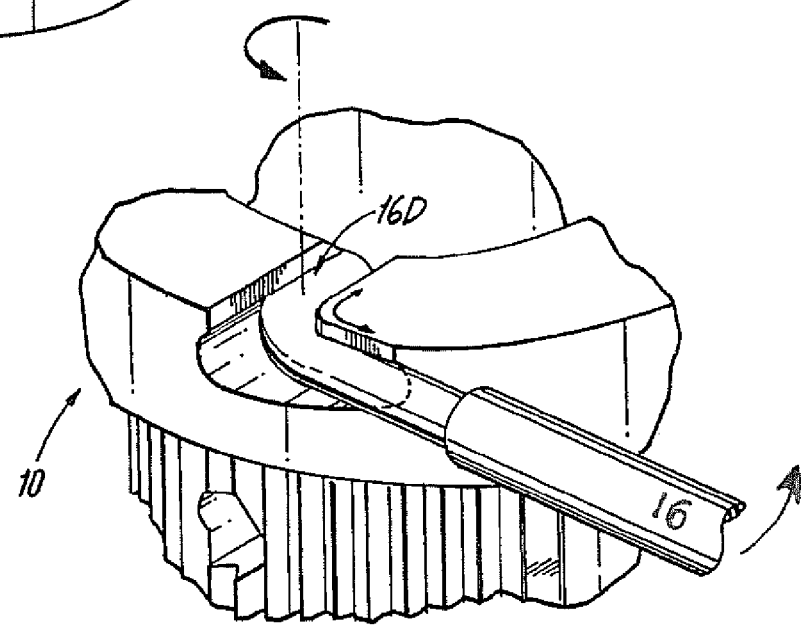
FIG. 2B is a portion of FIG. 2A shown in an in-use condition with a wire-bending in position.

In FIGS. 2, 2A, and 2B, is an exploded perspective view of the hand tool 100 shown in FIG. 1 having a wire shaping device 10 an electrical testing indicator 1 in accordance with the present invention at a second end 128. As shown in FIG. 2, electrical testing indicator 1 is preferably inserted coaxially within second end 128 of handle 108, while a wire shaping device 10 may be molded coaxially within a first end 126A of handle 108. As shown, handle 108 of hand tool 100 is preferably disclosed herein as the handle of a bit driver, but of course handle 108 may be a handle to any number of other tools used by electrical installers. Further, handle 108, electrical testing indicator 1 and wire shaping device 10 are generally disclosed as being generally cylindrical in shape. However, handle 108, electrical testing indicator 1 and wire shaping device 10 may be configured in various other shapes and sizes depending on the particular use of the hand tool 100.

As illustrated, it can be appreciated that the interior of variable master bit retaining couplings 114 and symmetric bit retaining couplings 118 may alternatively have hexagonally, square, pentagonally, heptagonally, octagonally, etc. shaped inner portions 126 that serve as a nut driver without departing from the scope and spirit of the present invention. The couplings 114, 118 optionally have at opposite ends thereof hexagonally shaped inner portions 126. Accordingly, hand tool 100 may be a multi-function tool that includes eight screwdrivers as well as five nut drivers along with the wire shaping device 10 according to the invention, and the ends 13, 16 thereof may also be used a drivers. This may result in hand tool 100 functioning as at least fourteen, or more different tools in one hand tool 100.

Referring to FIGS. 2A and 2B specifically, wire shaping device 10 includes a plurality of profiled wire retaining openings 16A, 16B, and 16C, formed for different gauge (diameter) wires 16. Engaging ribs 15 are shown for molding strength with handle 108 but may be optionally formed sufficient to secure device 10 in handle 108. Wire 16 has an insulated and exposed portion. Exposed wire portion 16D is positioned within one of the openings 16A-C, and bent, (arrow as shown) about the perimeter radius (as shown), while being releasably-retained by the upper portion walls of the profile and curved side walls and lips (atlas shown). It will be noted that member 114 (FIG. 1) is provided with one or more rotation-prevention extensions that fit within grooves 17 shown in shaping device 10 to prevent unintentional rotation.

Figure 3:
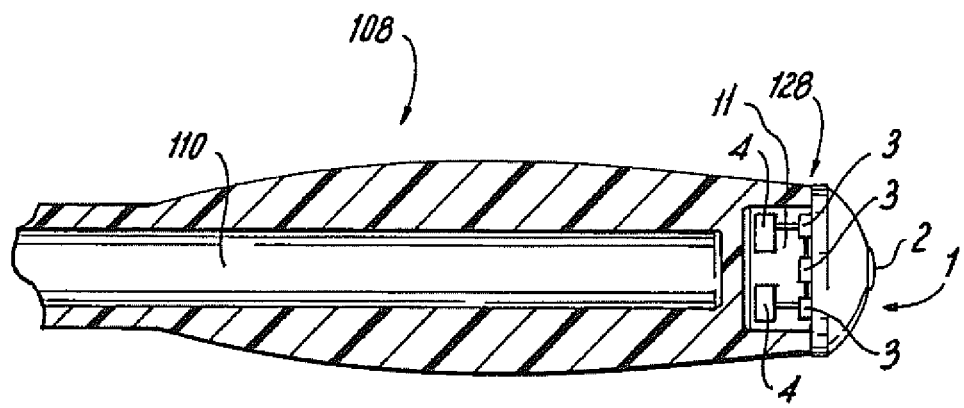
FIG. 3 shows a partial sectional side view of the handle of a hand tool having an electrical testing indicator according to a preferred embodiment of the present invention.
Figure 4:
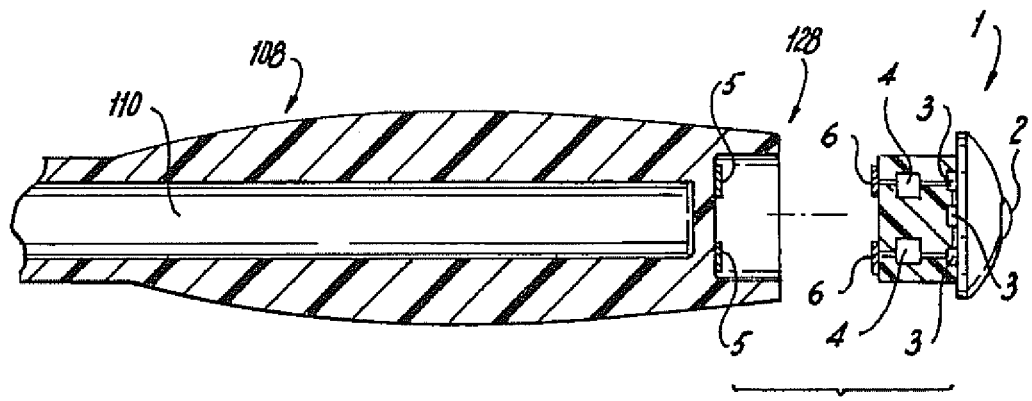
FIG. 4 shows an exploded partial sectional view of the hand tool having an electrical testing indicator as shown in FIG. 3.
Figure 5:
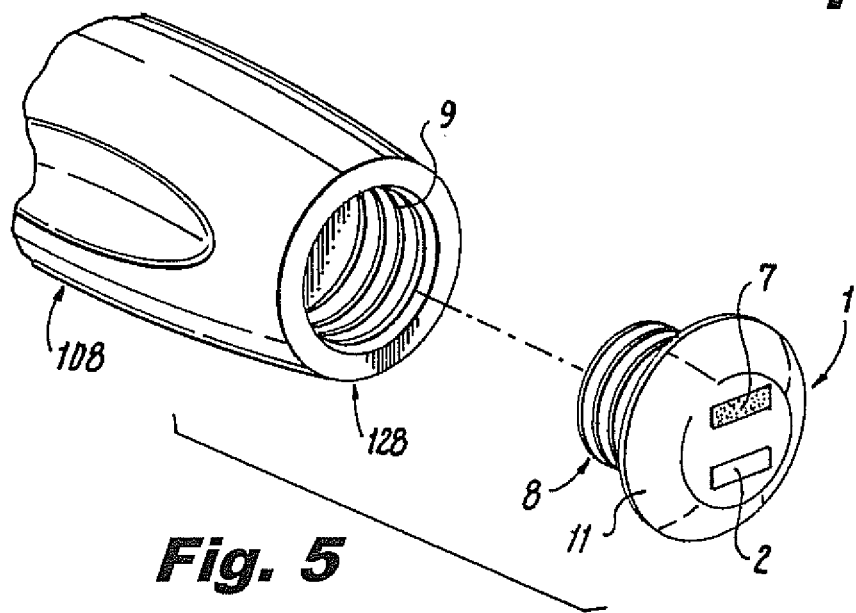
FIG. 5 shows an exploded partial perspective view of a general handle having an electrical testing indicator according to an alternative embodiment of the present invention.

Turning next to FIGS. 3-5, shown is a side view of a handle of a hand tool having an electrical testing indicator 1 according to the preferred embodiment of the present invention. With reference to FIGS. 3-5, a new handheld electrical tester embodying the principles and concepts of the present invention and generally designated by the reference numeral 1 will be described. As shown, indicator 1 is configured to be incorporated into the standard handle 108 of a hand tool such as a tool driver 100. Of course, the indicator may be configured to be incorporated into any number of different hand tools utilized by electrical technicians. Preferably, indicator 1 comprises a body 11 having first and second ends, the body having one or more electrical circuits 3 (or other circuit means) contained therein, one or more power sources 4 such as one or more batteries, electrical connectors communicating with electrical circuit means 3 and electrically connected to contacts 6 (see FIG. 4) extending from a first end of the body 11, a power lead having a first end communicating with the electrical circuit means 3 and a second end communicating with a first power source 4, and a second power lead having a first end communicating with the electrical circuit means 3 and a second end communicating with a second power source 4. When indicator 1 is fully inserted into a first end 128 of handle 108 of the hand tool, contacts 6 connect with or come in electrical contact with leads 5 (see FIG. 4) or electrically conducting components of the hand tool (which may be within a central bore 110 of handle 108) such that a component extending from a second end 126 of handle 108 may be placed in contact with a wire or device to be tested.

Optionally, it will be understood, that electrical tester system 1 may be configured without needing electrical contact leads 5 in handle 108, and may instead be independently operable from handle 108, but for being removably retained therein (as will be discussed with thread engagement 8) for battery replacement.

Also, indicator 1 further optionally comprises on its out end a visual indicator 2 connected to electrical circuit means 3. Visual indicator 2 may any type of known light (an LED type or otherwise) or other visual display that will alert the user to the status of the wire or device being tested. Optionally, a plurality of lights 2 may be coupled to the housing 11 and electrical circuit means 3 such that lights 2 may be lit in a pattern indicating a state of the wire or device being tested (highly charged, no charge, green, red, yellow, etc.). Also optionally, a speaker 7 (see FIG. 5) may be coupled to the housing 11 and electrical circuit means 3 for creating an audible tone to indicate a state of the wire or device being tested. It is also optional that speaker 7 may instead be configured as an eccentric vibration system 7, providing a vibration indication during a use, within the scope and spirit of the present invention.

Alternatively, the plurality of lights 2 includes a first light, a second light and a third light. The first light may be associated with a first contact point, the second light associated with a second contact point, and the third light associated with a third contact point. The lights 2 are for emitting light upon current passing from the wire or device through the contact probe or tip to the electrical circuit means 3. The housing 11 may also have a status indicia for indicating a status of the wire or device upon comparison of the status indicia with the lights 2 that are lit.

Preferably, indicator 1 is either press fit or threaded within first end 128 of handle 108 to secure indicator in position such that contacts 6 connect with or come in electrical contact with leads 5 (as an optional, non-mandatory system). Alternatively, housing 11 of indicator 1 may comprise any number of known means for securing indicator 1 within a bore of a first end 128 of handle 108, such as having both the exterior of housing 11 having threads 8 which will cooperate with threads 9 on the inner wall of the bore in the first end 128 of handle 108 to securely fix indicator 1 within handle 108 such that contacts 6 connect with or come in electrical contact with leads 5. Other connection means known to a person of skill in the art may also be used in accordance with the invention.

Figure 6:
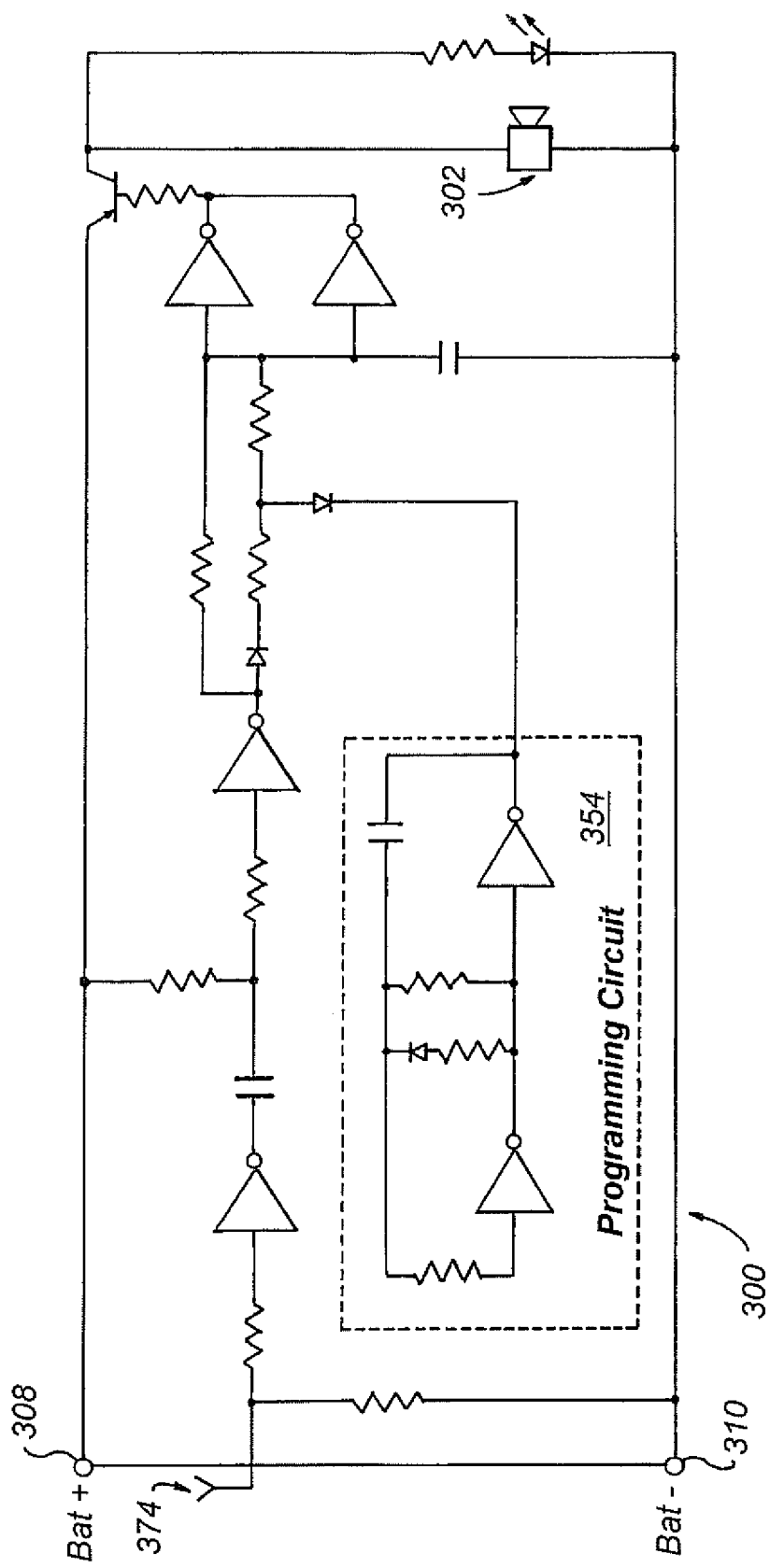
FIG. 6 shows a schematic diagram of known circuitry that may be used in accordance with the present invention.

Referring lastly to FIG. 6, shown is one example of a schematic diagram of a circuit 300 which may be located within the electrical testing indicator 1 according to the present invention. As shown, circuit 300 may have an antenna 374 to sense the presence of electrical energy radiated from an electrically conductive member, such as a wire, when the tip of the testing indicator 1 is positioned near the electrically conductive member. A battery source 308, 310, or speaker 302 may be provided. It will be understood, that a programming and processing circuit 354 receives signals and interprets the same to trigger lights, sound, vibration, or other indications of the state of the electrical field sensed interpreted as a wire electrification-condition. In this embodiment, the circuit 300 functions to alert a user to the presence of electrical energy that has a constantly changing electromagnetic field. Such a circuit is more fully disclosed in U.S. Pat. No. 6,828,767 which is incorporated by reference in its entirety.

During use of the electrical tester according to the present invention, a user would connect the present invention to a wire, device or electrical outlet to test its condition. The present invention can also be used to test the condition of light switches. As known to a person of ordinary skill in the art, the present invention may test for the following conditions; correct wiring when the second light is lit, an open ground when the second and the third light are lit, reversed polarity when the third is lit, an open hot when all three lights are lit, an open neutral when the first light and the second are lit, the hot and ground reversed when the first light is lit, a hot on neutral with hot open when the first and the third lights are lit, lamp out when the lamp out light is lit. As to a further discussion of the manner of usage and operation of the present invention, the same should be apparent from the above description. Accordingly, no further discussion relating to the manner of usage and operation will be provided.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention. Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

In the claims, means or step-plus-function clauses are intended to cover the structures described or suggested herein as performing the recited function and not only structural equivalents but also equivalent structures. Thus, for example, although a nail, a screw, and a bolt may not be structural equivalents in that a nail relies on friction between a wooden part and a cylindrical surface, a screw's helical surface positively engages the wooden part, and a bolt's head and nut compress opposite sides of a wooden part, in the environment of fastening wooden parts, a nail, a screw, and a bolt may be readily understood by those skilled in the art as equivalent structures.

Having described at least one of the preferred embodiments of the present invention with reference to the accompanying drawings, it is to be understood that such embodiments are merely exemplary and that the invention is not limited to those precise embodiments, and that various changes, modifications, and adaptations may be effected therein by one skilled in the art without departing from the scope or spirit of the invention as defined in the appended claims. The scope of the invention, therefore, shall be defined solely by the following claims. Further, it will be apparent to those of skill in the art that numerous changes may be made in such details without departing from the spirit and the principles of the invention. It should be appreciated that the present invention is capable of being embodied in other forms without departing from its essential characteristics.

What is claimed is:

1. A hand tool system comprising:
   a handle having a first end and a second end;
   a plurality of integral double-ended tool bit members;
   a shank having a proximate end disposed in said first end of said handle and a distal end; and
   an electrical circuit test indicator comprising:
   a housing having one or more contacts extending from a bottom end of said housing, said contacts being adapted for engaging corresponding contacts within said handle;
   an electrical circuit means for detecting the presence of electrical energy radiated from an external electrically conductive member;
   one or more lights being coupled to said housing, said lights being lit in a manner indicating a state of the electrical circuit; and
   at least one power source coupled to said electrical circuit means, said contacts, and said one or more lights;

wherein each of said test contacts extends through said bottom surface of said housing such that said contacts said corresponding contacts within said handle;

wherein said shank comprises means for removably holding said plurality of integral double-ended tool bit members and comprising a unitary one-piece first cylindrical housing having oppositely disposed ends, a second unitary one-piece cylindrical housing having oppositely disposed ends for removably holding first integral double-ended tool bit members, said second housing being slidably received in one said end of the first housing, said first integral double-ended tool bit members being slidably received in said second housing ends, a third unitary one-piece cylindrical housing having oppositely disposed ends for removably holding second integral double-ended tool bit members, said third housing being slidably received in the other end of the first housing, said second integral double-ended tool bit members being slidably received in the third housing ends, wherein one tool bit member is operably disposed in the distal end of the shank.

2. The hand tool system of claim 1, wherein said apparatus further comprises a speaker coupled to said housing, said speaker creating an audible tone to indicate a state of the electrical circuit.

3. The hand tool system of claim 2, wherein said contacts are adapted for operationally coupling to opposing poles of a switch such that said switch determines if said light or said speaker is used to indicate the state of said electrical circuit.

4. The hand tool system of claim 1, wherein an exterior wall of said housing is threaded to cooperate with a threaded inner wall of a central bore in an end of said handle.

5. The hand tool system of claim 1, wherein said housing is press fit into an end of said handle.

6. The hand tool system of claim 1, further comprising:
a wire bending member operative for bending a wire.

7. An electrical circuit tester system, for testing an electrical circuit or device, the electrical circuit tester system comprising:
a handle including a housing having one or more contacts extending from a bottom end of said housing, said contacts being adapted for engaging corresponding contacts within said handle;
an electrical circuit means for detecting the presence of electrical energy radiated from an electrically conductive member;
one or more lights being coupled to said housing, said lights being lit in a manner indicating a state of the electrical circuit; and
at least one power source coupled to said electrical circuit means, said contacts, and said one or more lights;
wherein each of said test contacts extends through said bottom surface of said housing such that said contacts said corresponding contacts within said handle, and
wherein said contacts are adapted for operationally coupling to opposing poles of a switch such that said switch determines if said light or said speaker is used to indicate the state of said electrical circuit.

8. The electrical circuit tester system of claim 7, wherein said tester further comprises a speaker coupled to said housing, said speaker creating an audible tone to indicate a state of the electrical circuit.

9. The electrical circuit tester system of claim 7, wherein an exterior wall of said housing is threaded to cooperate with a threaded inner wall of a central bore in an end of a handle of a hand tool.

10. The electrical circuit tester system of claim 7, wherein said housing is configured to be press fit into an end of a handle of a hand tool.

* * * * *